United States Patent [19]

Yaakobi

[11] Patent Number: 4,665,541

[45] Date of Patent: May 12, 1987

[54] X-RAY LITHOGRAPHY

[75] Inventor: Barukh Yaakobi, Rochester, N.Y.

[73] Assignee: The University of Rochester, Rochester, N.Y.

[21] Appl. No.: 783,791

[22] Filed: Jul. 11, 1985

Related U.S. Application Data

[63] Continuation of Ser. No. 501,600, Jun. 6, 1983, abandoned.

[51] Int. Cl.$^4$ ............................................. G21K 5/00
[52] U.S. Cl. ...................................... 378/34; 378/119
[58] Field of Search ......................... 378/34, 35, 119; 430/325, 328, 330, 967

[56] References Cited

U.S. PATENT DOCUMENTS

| | | |
|---|---|---|
| 3,743,842 | 7/1973 | Smith et al. |
| 3,883,351 | 5/1975 | Lewis ............................. 430/325 |
| 4,021,242 | 5/1977 | Mewyear et al. ................ 430/325 |
| 4,184,078 | 1/1980 | Nagel et al. |
| 4,215,192 | 7/1980 | Buckley |
| 4,232,110 | 11/1980 | Taylor ............................. 430/967 |
| 4,292,384 | 9/1981 | Straughan et al. ............... 430/325 |
| 4,307,176 | 12/1981 | Mochiji et al. ................... 430/328 |
| 4,444,869 | 4/1984 | Chonan et al. ................... 430/328 |
| 4,465,768 | 8/1984 | Ueno et al. ...................... 430/325 |
| 4,588,675 | 5/1986 | Nakane et al. ................... 430/330 |
| 4,604,305 | 8/1986 | Deckman et al. ................ 430/330 |

FOREIGN PATENT DOCUMENTS 117626  6/1985  Japan ................................. 430/330

OTHER PUBLICATIONS

Nagel et al, "Submicrosecond X-Ray Lithography," *Electronics Letters*, vol. 14, No. 24, Nov. '78, pp. 781, 782.

Mallozzi et al, "Laser-Produced Plasmas as an Alternative X-Ray Source for Synchrotron Radiation Research and for Microradiography," *Advances in X-Ray Analysis*, Plenum Press, New York, 1979.

*Primary Examiner*—Carolyn E. Fields
*Attorney, Agent, or Firm*—Martin LuKacher

[57] ABSTRACT

Submicron x-ray lithography using a single shot of ultraviolet laser energy of one nanosecond (ns) duration and of relatively low energy to produce an x-ray pulse for exposing a resist to obtain a submicron pattern thereon. The incident x-ray flux used is about an order of magnitude smaller than heretofore required to obtain a comparable exposure with similar x-ray resists. A shield which transmits the x-ray pulse, but blocks the plasma material, is thermally coupled to the resist and heats the resist by transfer of the heat from the plasma thereto, upon exposure of the resist by the x-ray pulse.

20 Claims, 1 Drawing Figure

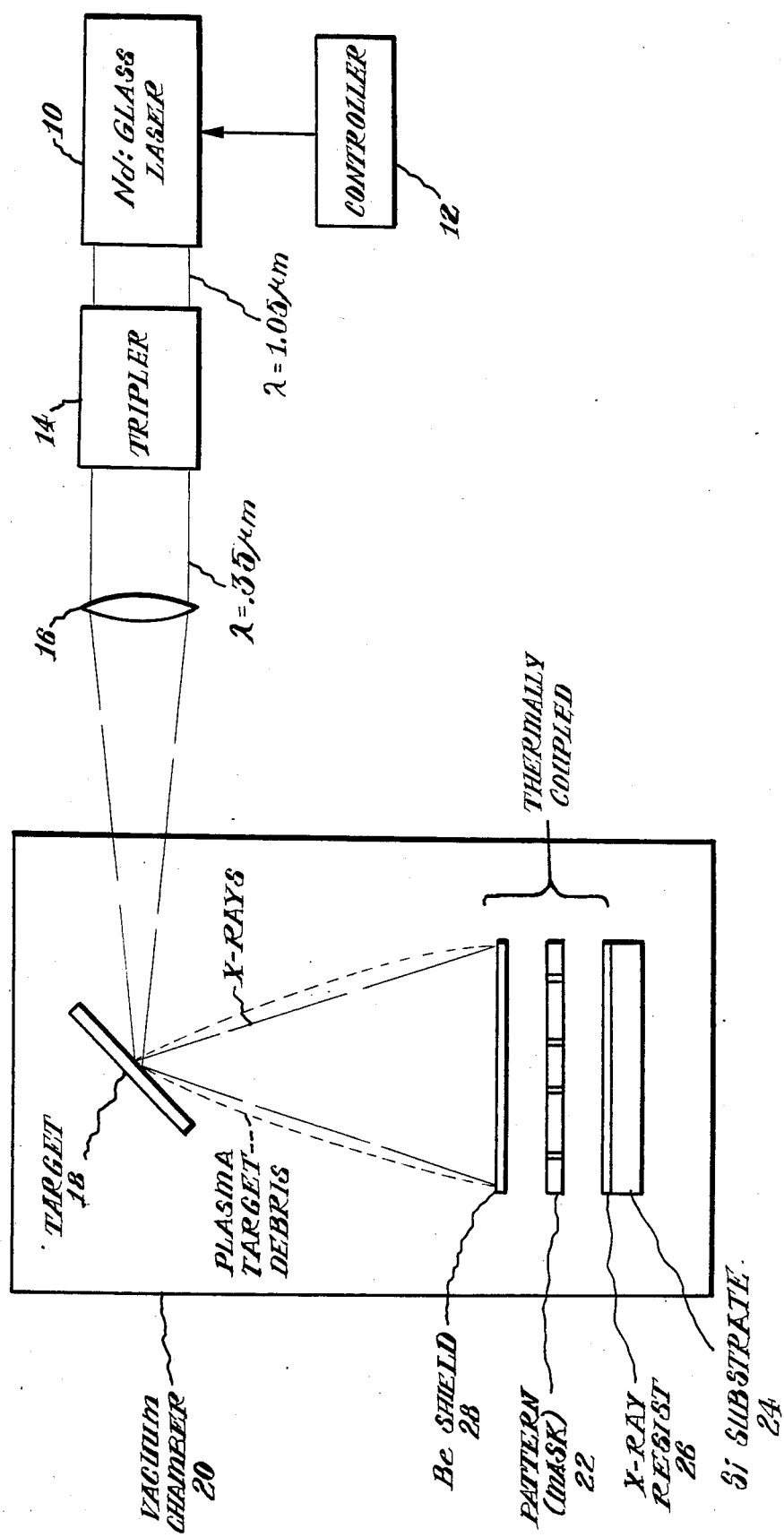

X-RAY LITHOGRAPHY

This is a continuation of application Ser. No. 501,600, filed June 6, 1983, now abandoned.

DESCRIPTION

The present invention relates to x-ray lithography, and particularly to submicron x-ray lithography using an ultraviolet, laser produced plasma as a source of x-rays.

The present invention is especially suitable for use in producing high-resolution, submicron patterns in resist material for use in constructing integrated circuits. The invention also has application wherever high resolution, submicron patterns are needed, which photolithography is incapable of producing.

X-ray lithography has been proposed wherein the x-rays are generated by the interaction of an electron beam and a metal target (see U.S. Pat. No. 3,743,842, issued July 3, 1973). The production of pulses of x-rays for lithography using a laser produced plasma has also been suggested (see U.S. Pat. No. 4,184,078, issued Jan. 15, 1980). Relatively long exposures of the x-ray sensitive material (e.g., x-ray resist) have, however, been required. For example, the system proposed in U.S. Pat. No. 4,184,078 requires the use of 90 laser shots to obtain sufficient absorbed x-ray energy to obtain an acceptable pattern after exposure and developing (see D. J. Nagel, et al., Electronic Letters, 14, 24, p. 781 (1978)). The minimum exposure which has been reported is a multi-nanosecond laser shot (a ten nanosecond pulse followed by a one nanosecond pulse) (see P. J. Mallozzi, et al., in *Advances in X-ray Analysis* (Plenum Press, New York, 1979)).

It has been found, in accordance with the invention that high resolution, submicron x-ray lithography can be carried out using an ultraviolet-laser produced plasma as a source of x-ray pulses. Only a single shot of about one nanosecond (ns) duration of UV laser energy is necessary to produce x-ray flux sufficient for exposure of conventional x-ray resist material. The exposure with the x-ray flux has been carried out with the aid of a shield which blocks the high temperature plasma in the form of debris from the target on which the UV laser pulse is incident. The shield is in thermally coupled relationship with the resist and causes the resist to be heated upon exposure by the x-ray flux. While shields have been used, they have not been used to heat the resist (see U.S. Pat. No. 4,184,078 and the Electronic Letters article, referenced above). The x-ray flux which is incident upon the resist is about an order of magnitude smaller than what has heretofore been required in order to obtain comparable exposures with x-rays from a laser produced plasma. While the invention is not limited to any theory of operation, the increased efficiency of transfer of x-ray energy to the resist enabling the reduction in the required x-ray flux may be due to an abrupt rise in the resist temperature contemporaneous with or after exposure and prior to the development of the resist to produce the pattern.

It is therefore a feature of the present invention to provide an improved method and apparatus for x-ray lithography wherein high resolution submicron patterns may be produced with a minimum of exposure by x-ray energy.

It is another feature of the invention to provide an improved method and apparatus for submicron, high resolution x-ray lithography through the use of conventional x-ray resists and conventional methods of developing such resists after exposure wherein the amount of x-ray energy which is generated is minimized.

It is a still further feature of the invention to provide an improved method of and apparatus for x-ray lithography using laser produced plasma as a source of x-rays, wherein long duration or multiple pulses of laser energy are not required for complete exposure of a pattern for lithographic purposes.

The foregoing and other features, objects and advantages of the invention, as well as the presently preferred embodiment of the invention and the best mode now known for practicing the invention, will be more apparent from a reading of the following description in connection with the accompanying drawing which is a schematic diagram of submicron x-ray lithography apparatus embodying the invention.

Referring more particularly to the drawing, there is shown a frequency tripled Nd:glass laser system using a Nd:glass laser 10. The laser is operated as a mode locked laser by a Pockels cell controller 12 to produce a single pulse of infrared laser light one ns in duration. The wavelength of this light is about 1.05 microns ($\mu$m). The light emanates from the laser in a beam which passes through a tripler 14 to produce a pulse of output light of approximately 0.35 $\mu$m in wavelength. The tripler may suitably be of the type described in Pat. No. 4,346,314, issued Aug. 24, 1982 to R. S. Craxton. The one ns pulse of ultraviolet light exits from the tripler 14 in a beam which is focused by a lens 16 to a spot on a flat target 18. In the event that lasers which produce sufficient power in short wavelengths (e.g., the ultraviolet) become available, they may also be used. The light is transmitted through a port in a vacuum chamber 20, which includes the target 14, a mask 22 which defines the pattern, a silicon substrate 24 having a coating 26 of x-ray resist, and a shield 28, suitably of beryllium. The chamber 20 may suitably be evacuated to a pressure of about $10^{-6}$ Torr.

The target is suitably of pure iron. Other metals of high atomic number materials may be used. The target may also be a microballoon containing the target material; for example, a material having a strong emission which matches the sensitivity of the photoresist when converted into a plasma by the laser pulse. The microballoon may be supported on a stalk as in laser fusion apparatus. Then the laser beam may be divided into a plurality (two or more) of beams which can implode the target and produce an intense and very small x-ray source.

The target material is heated by the laser pulse to x-ray emitting temperatures. A small mass of the target, for example, 50 nanograms is converted into a plasma. Most of the absorbed laser energy goes into kinetic energy of the plasma (for example, seventy-three percent). The rest of the energy is converted into the x-ray flux. Suitably, the Nd:glass laser produces a one nanosecond, 35 Joule (J) laser pulse, after frequency tripling. The total x-ray energy emitted by the iron target 18 is then approximately 5.7 J. The remainder of the energy is converted into the heated plasma. The x-rays radiate as radial rays from the focal spot on the target onto which the laser pulse is focused by the lens 16. This spot may be approximately 100 $\mu$m in diameter. The x-rays project towards the shield 28, the pattern 22 and the resist 26. The shield 28, pattern 22 and resist 26 assembly may be positioned at an angle closer to the axis of the laser beam than shown. The inclination of the target 18 may be closer to normal to the laser beam. This alternate arrangement may increase the x-ray flux effective on the resist 26. The plasma or target debris also is projected towards this assembly of shield, pattern and resist. The x-rays are indicated by the lines made up of longer dashes while the plasma/target debris is indicated by the lines made up of short dashes.

Consider the arrangement of the shield 28, mask 22, resist 26 and substrate 24. The resist and the substrate may be supported on a heat-sink, for example, of aluminum. It is not believed that the resist is heated by absorbed x-rays, since the weak exposure can only raise the resist temperature by a few degrees. The resist may be any conventional resist such as PBS (poly butyl sulfide), PMMA (poly methyl methacrylate) or COP (poly glyclycidyl methacrylate-co-ethyl acrylate). After exposure, the resist may be developed by known methods, for example, as described in U.S. Pat. No. 4,215,192 issued July 29, 1980, in the case of COP. The resist properties and development techniques are also discussed in L. F. Thompson, et al., J. Electrochem. Soc.: Solid State Sci. Techn., 121, 1500 (1974) and P. D. Lenzo, et al., Appl. Phys. Lett. 24, 289 (1974).

The mask is suitably a gold grating which is supported along its edges in a frame. The width of the grating lines and their separations may be approximately 0.45 $\mu$m. The mask 22 is suitably spaced in close proximity to the surface of the resist 26; a 25 $\mu$m spacing being suitable. The shield 28 is also in close proximity to the resist 26 so as to be thermally coupled thereto. For example, the resist may be 5 mm from the mask 22. The hot plasma/target debris is blocked by the shield 28 and causes heating thereof. Because the shield is in close proximity and thermally coupled to the resist, the resist is heated. Thermal coupling may occur by radiational coupling and conductive coupling, as through the frame or other support structure for the assembly, which is used but not shown to simplify the drawing. The resist may reach a temperature approximately equal to the glass transition temperature of the polymer constituting the resist 26; for example, a temperature of about 100° C. Heating of the resist occurs soon after the exposure of the resist by the x-rays. This is because the target debris arrives at the shield 28 with a delay of approximately one microsecond, which is long after the exposure has taken place; the x-rays travelling at the speed of light and both the x-rays and the plasma being produced essentially simultaneously at the surface of the target. Other shields may be used, depending upon the transmissivity to x-rays which is desired. The shield 28 passes x-rays above about 1 keV. While other materials, such as Mylar also have x-ray transmissive and plasma blocking properties, beryllium is preferred, since it transmits more x-rays for a given plasma blocking capability.

As mentioned above, approximately 27% of the laser energy which is absorbed in the target 18, is converted into x-rays. The efficiency of x-ray production by a UV laser light is high, even though some of the laser energy is lost in the tripler 14. The beryllium shield 22, which is suitably 18 $\mu$m thick, acts as a filter of the total x-ray energy (5.7 J), and approximately 0.72 J is transmitted through the beryllium shield 28. The x-ray energy density incident on the resist 26, which is located 10 cm from the target 20 is approximately 0.57 mJ per cm$^2$. The total x-ray energy per unit volume absorbed at the surface of the resist is 0.9 J per cm$^3$. With conventional x-ray lithography as reported in the above referenced Thompson, et al. and Lenzo, et al. articles, approximately 14 J per cm$^3$ of laser energy must be absorbed in the same resist in order to obtain an exposure equivalent to that obtained with the 0.9 J per cm$^3$ energy absorbed in the exemplary apparatus described herein. This is an order of magnitude less x-ray flux (energy) than has heretofore been needed for obtaining a complete exposure. The system is therefore more sensitive by an order of magnitude than systems of x-ray lithography heretofore proposed.

Variations and modifications in the herein described method and apparatus, will undoubtedly suggest themselves to those skilled in the art. In particular, heating of the resist upon or following exposure can be applied by any other method of heating, to any other resist and relating to any other radiation source or particles source used for registering a pattern. Accordingly, the foregoing description should be taken as illustrative and not in a limiting sense.

I claim:

1. The method of x-ray lithography which comprises the steps of generating a single pulse of light having a wavelength in the ultraviolet and a duration not exceeding about one ns, translating said light pulse into a pulse of x-rays, and exposing an x-ray sensitive resist with the x-ray pulse to produce a pattern therein.

2. The method according to claim 1 further comprising the step of increasing the temperature of said resist after exposure to said x-ray pulse.

3. The method according to claim 2 wherein said temperature increasing step is carried out by placing a shield of x-ray transmissive material in the path of said x-ray pulse to said resist and thermally coupled to said resist.

4. The method according to claim 2 wherein said temperature increasing step comprises the step of placing a shield of material which blocks a target material and is heated thereby in thermally coupled relationship with said resist.

5. The method according to claim 1 wherein said translating step is carried out by directing said light pulse to be incident upon a target to produce a plasma of target material which emits said x-ray pulse.

6. The method according to claim 1 wherein said generating step is carried out by producing a beam of laser light, and said translating step is carried out by placing a target in the path of said laser beam to produce a plasma which emits said x-ray pulse.

7. The method according to claim 6 further comprising focusing said laser beam upon a spot approximately 100 $\mu$m on said target.

8. The method according to claim 1 wherein said generating step is carried out by producing a single pulse of infrared laser light and tripling the wave length of said infrared laser light pulse, and said translating step is carried out by making the tripled laser light pulse incident on a target which faces said resist.

9. The method according to claim 8 wherein said infrared laser light pulse has a wave length of approximately 1.05 $\mu$m and said tripled laser light pulse has a wave length of approximately 0.35 $\mu$m.

10. In apparatus for laser lithography wherein an x-ray mask defining a pattern is positioned in proximity to a substrate having an x-ray sensitive resist material thereon, the improvement comprising means including a laser for producing a single pulse of ultraviolet light having a duration of about 1 ns, a target upon which said laser pulse is incident to produce a plasma from which an x-ray pulse corresponding to said laser pulse is transmitted to expose said resist through said mask.

11. The invention according to claim 10 further comprising a shield of material which intercepts target material in said plasma and is heated thereby and which transmits said x-ray pulse disposed between said target and said mask and in close proximity to said mask and thermally coupled thereto for heating said resist upon exposure thereof by said x-ray pulse.

12. The invention according to claim 11 wherein said shield is a body of beryllium.

13. The invention according to claim 12 wherein said beryllium shield is a sheet approximately 18 $\mu$m thick placed approximately 25 $\mu$m from said resist.

14. The invention according to claim 10 wherein said means including a laser includes a laser operative in the infrared and a tripler which translates the output of said laser to the ultraviolet.

15. The invention according to claim 14 further comprising means for focusing the ultraviolet light from said tripler on the surface of said target to a spot of 100 $\mu$m diameter or less.

16. The invention as set forth in claim 10 wherein the laser output wave length is approximately 1.05 $\mu$m and said tripler output wave length is approximately 0.35 $\mu$m.

17. The invention according to claim 16 wherein the energy of said laser pulse of 0.35 $\mu$m is about 35 J.

18. The invention according to claim 10 wherein said resist is selected from PBS, COP, and PMMA.

19. The invention according to claim 11 wherein said target consists of pure iron.

20. The invention according to claim 10 wherein said x-ray pulse presents an energy for absorption by said x-ray resist of approximately 1 J per $cm_3$.

* * * * *